(12) United States Patent
Ishida

(10) Patent No.: US 8,101,982 B2
(45) Date of Patent: Jan. 24, 2012

(54) MEMORY DEVICE WHICH COMPRISES A MULTI-LAYER CAPACITOR

(75) Inventor: Takehisa Ishida, Singapore Science Park, II (SG)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/624,529

(22) Filed: Jan. 18, 2007

(65) Prior Publication Data

US 2007/0205449 A1 Sep. 6, 2007

(30) Foreign Application Priority Data

Mar. 2, 2006 (SG) .................. SG200601305-6

(51) Int. Cl.
*H01L 29/94* (2006.01)

(52) U.S. Cl. ......... 257/295; 257/E27.104; 257/E21.663; 257/E21.664; 365/49.13; 365/65; 365/145

(58) Field of Classification Search .................. 257/295, 257/E27.104, E21.663, E21.664; 438/3; 365/49.13, 65, 145
See application file for complete search history.

(56) References Cited

U.S. PATENT DOCUMENTS

| | | | | |
|---|---|---|---|---|
| 4,700,457 A | * | 10/1987 | Matsukawa | .................. 438/396 |
| 5,031,144 A | * | 7/1991 | Persky | .................. 365/145 |
| 5,375,085 A | * | 12/1994 | Gnade et al. | .................. 365/145 |
| 5,583,359 A | | 12/1996 | Ng et al. | |
| 5,986,298 A | | 11/1999 | Yoo | |
| 6,077,716 A | * | 6/2000 | Yoo | .................. 438/3 |
| 6,300,653 B1 | | 10/2001 | Pan | |
| 6,498,744 B2 | * | 12/2002 | Gudesen et al. | .................. 365/145 |
| 6,700,146 B2 | * | 3/2004 | Ito | .................. 257/295 |
| 6,737,690 B2 | * | 5/2004 | Higuchi et al. | .................. 257/295 |
| 6,753,193 B2 | * | 6/2004 | Kim | .................. 438/3 |
| 6,800,890 B1 | * | 10/2004 | Wohlfahrt et al. | .................. 257/295 |
| 7,227,770 B2 | * | 6/2007 | Nishihara | .................. 365/145 |
| 2004/0014248 A1 | | 1/2004 | Kim | |
| 2004/0124536 A1 | * | 7/2004 | Yabuki | .................. 257/758 |
| 2004/0152258 A1 | * | 8/2004 | Kiyotoshi | .................. 438/253 |
| 2004/0209420 A1 | * | 10/2004 | Ljungcrantz et al. | .................. 438/239 |
| 2005/0221565 A1 | * | 10/2005 | Tamura et al. | .................. 438/295 |
| 2006/0073616 A1 | * | 4/2006 | Ohashi et al. | .................. 438/3 |
| 2006/0160251 A1 | * | 7/2006 | Dyreklev et al. | .................. 438/3 |

FOREIGN PATENT DOCUMENTS

WO 96/27907 9/1996

* cited by examiner

*Primary Examiner* — Zandra Smith
*Assistant Examiner* — Eric Ward
(74) *Attorney, Agent, or Firm* — K&L Gates LLP

(57) ABSTRACT

A memory device is provided. The memory device including memory cells having at least three stacked electrodes spaced apart pairwise by dielectric material so that the pairs of electrodes form respective capacitor layers. The capacitors are connected electrically in parallel to each other. The dielectric material is optionally ferroelectric material, in which case the capacitors are ferrocapacitors.

5 Claims, 3 Drawing Sheets

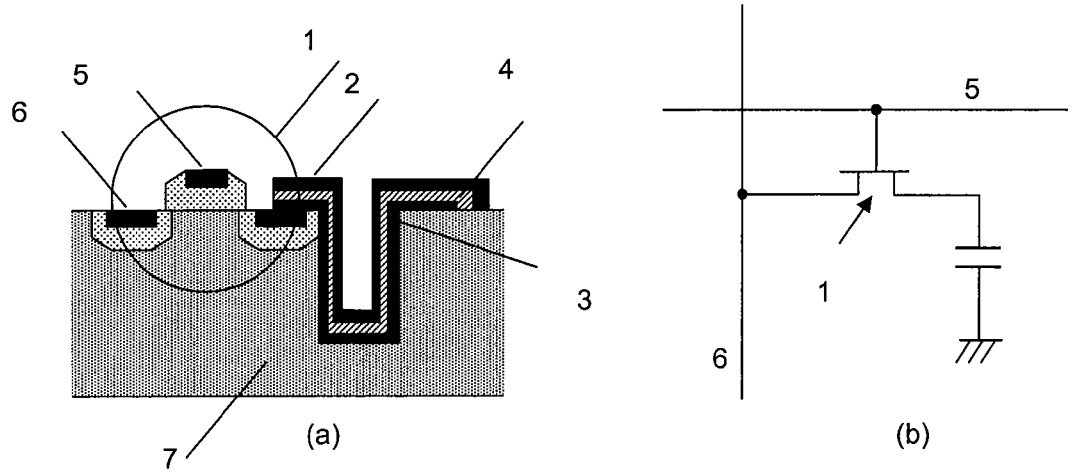
Fig. 1
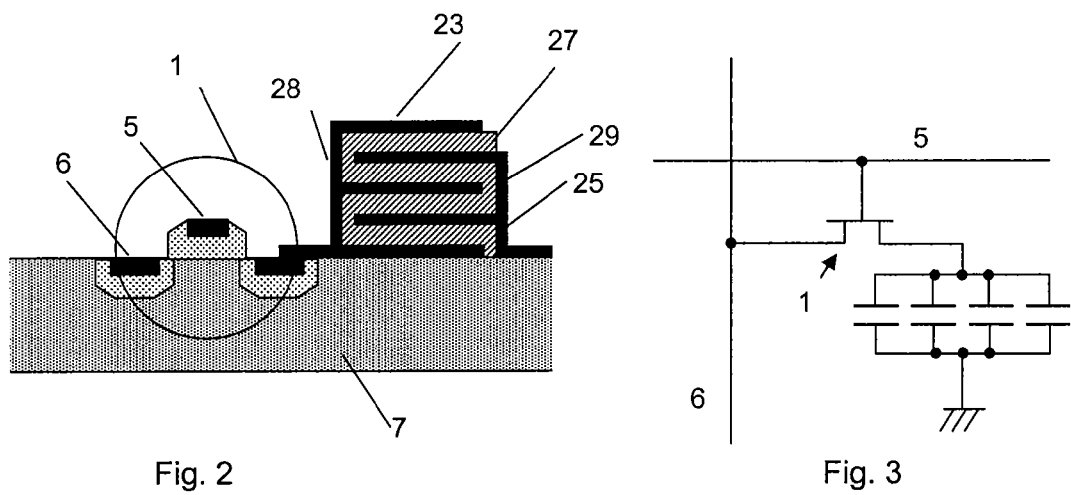
Fig. 2
Fig. 3
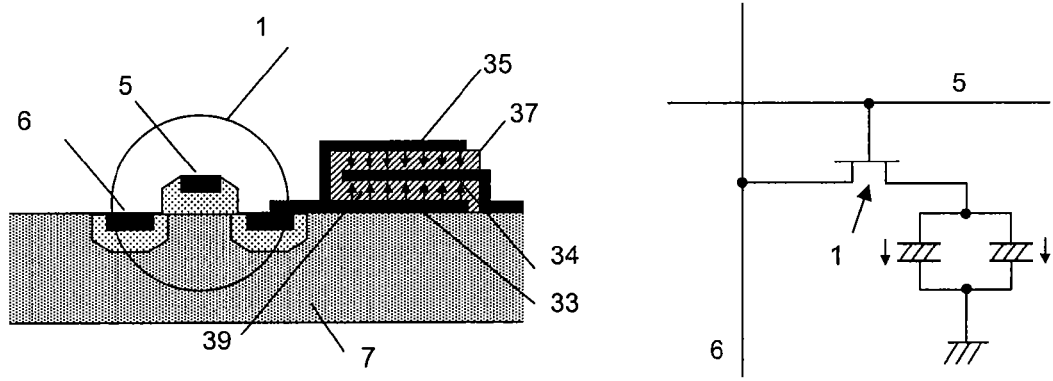
Fig. 4
Fig. 5

MEMORY DEVICE WHICH COMPRISES A MULTI-LAYER CAPACITOR

The present application claims priority to Singaporean Patent Application SG200601305 filed in the Singapore Patent Office on Mar. 2, 2006, the entire contents of which being incorporated herein by reference.

BACKGROUND

The present application relates to a memory devices. In particular, the present application relates to memory device having a capacitor structure.

The capacity of semiconductor memory devices such as Dynamic Random Access Memory (DRAM) or Static Random Access Memory (SRAM) is increasing steadily following Moore's law which predicts that the number of transistors on a chip doubles every 18 months. Manufacturers are making great efforts to maintain this rate of improvement. One of the major issues is how to fabricate a capacitor in a smaller area without reducing its capacitance, since in order to obtain reliable data retrieval large capacitance is required.

One solution is to form a deep trench on a silicon substrate and fabricate a capacitor in it so that the surface area, which is proportional to the capacitance, is increased. This structure is illustrated in FIG. 1(a), and the equivalent circuit diagram is shown in FIG. 1(b). A transistor (the region marked generally as 1) is formed on a substrate 7 with two of its terminals connected respectively to a word line 5 and a bit line 6. The third terminal of the transistor is electrically connected to an electrode 3 which is one of a pair of electrodes 2, 3 sandwiching a dielectric layer 4. The electrodes 2, 3, expend over the surfaces of a trench in the substrate 5. Unfortunately, this structure requires a complicated fabrication process that pushes up its production cost.

In separate developments, ferroelectric random access memory (FeRAM) is starting to be utilized for a certain category of products making use of its non-volatility. Since it does not require any electric power to maintain the stored data, it is suitable for use in passive devices, such as RF tags or IC cards. A single memory cell consists of a thin film of a ferroelectric material and a pair of electrodes which are located respectively on the top and bottom surfaces of said ferroelectric thin film. Information is stored as a direction of polarization induced in the ferroelectric film. The ferroelectric material itself may be organic or inorganic. In general, organic ferroelectric materials have the advantages of easier fabrication and inexpensiveness. However, the remanent polarization of organic material is not as large as that of inorganic material, so the readout signal is lower. Raising the read-out signal would be advantageous, to obtain more reliable data retrieval.

SUMMARY

In an embodiment, a memory device comprising memory cells having at least three stacked electrodes, spaced apart pairwise by dielectric material, so that the pairs of electrodes form respective capacitor layers is provided. The capacitors are connected electrically in parallel to each other.

This makes it possible to store a larger amount of charge (or dipole) per unit area than a memory cell having only one capacitor. Accordingly, it may enhance the readout signal.

In an embodiment, the dielectric material is a ferroelectric material, so that each of the capacitors is a ferroelectric capacitor.

The memory device may be of the type in which each memory cell comprises a transistor having inputs for receiving a test signal and a control signal, so that transistor applies the test signal to the capacitor structure according to the voltage of the control signal.

Alternatively, the memory device may have a so-called cross point structure, in which the word and bit lines themselves play a role as electrodes. In this case, the memory device includes at least two sheets of ferroelectric material arranged in a face-to-face configuration. Each sheet of ferroelectric material is between a set of word lines and a set of bit lines, and each memory cell is constituted by an intersection between the word lines and the bit lines. Optionally, the sheets of ferroelectric material may be separated by an isolation layer.

Additional features and advantages are described herein, and will be apparent from, the following Detailed Description and the figures.

BRIEF DESCRIPTION OF THE FIGURES

FIG. 1 is composed of FIGS. 1(a) and 1(b), which are respectively a schematic cross-sectional view of a conventional DRAM memory cell structure which has a trenched capacitor, and an equivalent circuit.

FIG. 2 is a schematic cross-sectional view of a memory cell which is a first embodiment of the invention comprising four layers of capacitors.

FIG. 3 shows an equivalent circuit to the memory cell of FIG. 2.

FIG. 4 is a schematic cross-sectional view of a memory cell which is a second embodiment of the invention comprising two capacitor layers.

FIG. 5 shows an equivalent circuit to the memory cell of FIG. 4.

DETAILED DESCRIPTION

Figure 6:
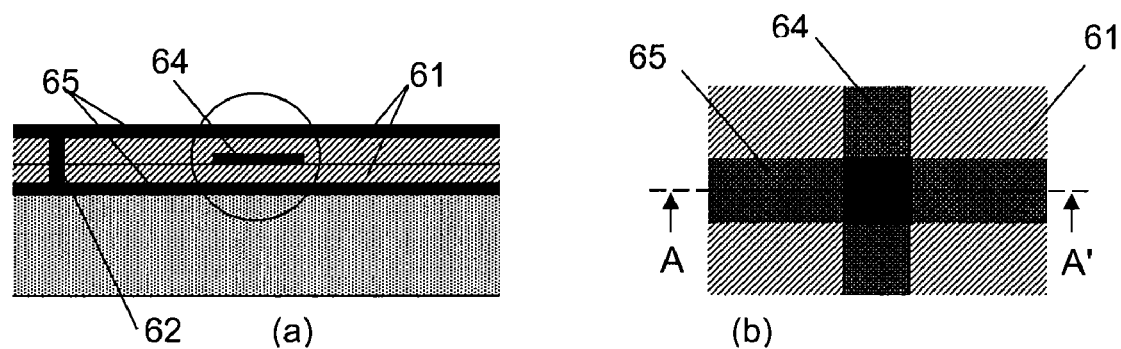
FIG. 6, which is composed of FIGS. 6(a) and 6(b), shows schematically a third embodiment of the invention which is a ferroelectric memory device having cross point memory cells.

Referring to FIG. 2, a memory cell in an embodiment is shown schematically. Elements of the structure of FIG. 2 identical to those of the structure of FIG. 1 are given the same reference numerals. In contrast to FIG. 1, the single-layer capacitor is replaced by a structure having two mutually electrically insulated conductive structures 23, 25 spaced apart by a dielectric layer 27. The conductive structure 23 includes three electrode layers, vertically disposed one above the other, and electrically connected to each other by a vertically extending conductive wall portion 28. The conductive structure 25 includes two electrode layers electrically connected to each other by a conductive wall portion 29. The electrode layers of the conductive structures 23, 25 are interleaved with each other, so that each pair of vertically adjacent electrode layers forms a capacitor. Thus, there are effectively four capacitor, where each capacitor includes a pair of electrodes spaced apart by an insulator layer which is a portion of the dielectric layer 27. The electrodes are connected alternately by the walls 28, 29, so that they form a set of four parallel capacitors. Each capacitor may be considered as a capacitor layer comprising: the upper portion of one of the electrodes, the section of dielectric directly above it, and the lower portion of the electrode directly above that.

A conductive metal material such as TiN, W, Al or Cu can be used for the electrode layers of the conductive structures 23, 25. A material which has a larger dielectric constant such as $Ta_2O_5$ or $ZrO_2$ is suitable for use as the dielectric layer 27.

FIG. 3 shows the equivalent circuit to FIG. 2. Since several capacitors are stacked in a small area, several times the capacitance can be obtained in comparison with a case in which a single capacitor is used. Thus, sufficient capacitance is achievable without a deep trench.

The writing and reading processes are the same as the conventional DRAM. The writing procedure is as follows. When information "1" is intended to be stored in a memory cell, a voltage of "high" level is applied to both the corresponding word line 5 and bit line 6. By this operation, a positive charge is stored in all the parallel capacitors. When information "0" is intended to be stored, a voltage of "high" level is applied to the word line 5 and a voltage of "low" level is applied to the bit line 6. By this operation, any charge in the parallel capacitors is discharged. The reading procedure is as follows. If the information stored in the memory cell is "1", a current induced by a discharge of the parallel capacitors is detected on the bit line 6 while a high level voltage is applied to the word line 5 and a low level voltage is applied to the bit line 6. If the information stored in the memory cell is "0", no current is induced on the bit line 6 while a high level voltage is applied to the word line 5 and a low level voltage is applied to the bit line 6.

Note that the number of capacitor layers is not limited to four. As long as there are at least two capacitor layers, there is an increase in capacitance compared to the case of a single capacitor layer which is proportional to the number of capacitor layers.

FIG. 4 is a schematic view of a ferroelectric memory device in another embodiment. Elements of the structure of FIG. 2 identical to those of the structure of FIG. 1 are given the same reference numerals. In this case, the capacitor structure comprises a first conductive structure having electrode layers 33, 35 connected by a vertical wall portion of the first conductive structure. The capacitor structure further comprises a second conductive structure comprising the electrode layer 34. The electrode layers 33, 34 are spaced apart by a ferroelectric layer 34, and the electrode layers 34, 35 are spaced apart by a ferroelectric layer 37. Thus there are two capacitor layers, each being a ferrocapacitor. The ferroelectric layers 34, 37 are part of a single ferroelectric body having a folded configuration. A copolymer of vinylidenefluoride and trifluoroethylene (P(VDF/TrFE)), for example, is a suitable material for the ferroelectric layers 34, 37, or alternatively $PbZrTiO_3$ (PZT) or $SrBi_2Ta_2O_9$ (SBT). The electrodes 33, 34, 35 are connected alternately so that they form a set of parallel capacitors. When a certain electric field (E) larger than the coercive field of the ferroelectric material (Ec) is applied between the two conductive structures, alternate polarization is induced as shown by the arrows in FIG. 4. FIG. 5 shows an equivalent circuit to FIG. 4. By utilizing this structure, the effective area of the surface electrodes is multiplied compared to a case in which there is only a single flat ferrocapacitor, and so the readout signal is enhanced.

The storing and retrieving schemes are as follows. When a certain level of positive electric field (E) which is higher than the coercive field of the ferroelectric thin film (Ec) is applied (i.e. E>Ec) between two conductive structures, the spontaneous polarization in the ferroelectric thin films 34, 37 become aligned with the applied electric field. Suppose this state to be "1". On the other hand, when a negative field (−E) stronger than −Ec is applied (i.e. |E|>|Ec|), the spontaneous polarization aligns with the negative direction, which is opposite to the direction associated with state "1". Suppose this state to be "0". Thus the single memory cell which consists of a multiple capacitors can memorize one data bit, namely, state "1" and "0".

The readout procedure is as follows. Suppose that the information "1" has been stored in the memory cell. When a negative field −E is applied between the electrodes on the cell, the field reverses the spontaneous polarization. At this time, electric displacement current caused by the polarization reversal can be observed on the lead attached to one group of electrodes. If the electric displacement current is observed, it is considered that the stored information was "1". Now, suppose that the information "0" had been stored in the memory cell. In that case, when the negative field −E was applied between the two groups of electrodes, the spontaneous polarization would not have been reversed by the field −E, because the polarization was already oriented in the negative direction. Therefore, no electric displacement current can be observed in case of state "0". Thus, it is determined whether the stored data is "1" or "0".

The number of capacitor layers in the second embodiment is not limited to two. As long as there is more than one layer, this structure improves the readout signal proportionally to the number of capacitor layers.

FIG. 6 shows another embodiment which is a ferroelectric memory device based on a so-called cross point structure. The memory device includes two parallel, flat ferroelectric layers 61 arranged touching each other in a facing configuration. On the respective outer surface of each of the layers 61, a plurality of parallel word lines 65 are formed. Each word line is in register with a corresponding word line on the outer surface of the other of the ferroelectric layers 61. Each pair of respective word lines 65 is electrically connected by an interconnection 62. Between the two ferroelectric layers 61 are bit lines 64 transverse to the word lines 65. Each memory cell is at the intersection of one of the bit lines 64 with one of the pairs of word lines 65. A portion of the structure including only a single memory cell is shown in top view (i.e. looking towards one of the layers 61) in FIG. 6(b), which additionally shows the position of the bit line 64 (which in this top view would normally be hidden between the layers 61). FIG. 6(a) is a cross-sectional view in the plane A-A' marked on FIG. 6(b). The upper surface (in FIG. 6(a)) of the bit line 64, the portion of the upper word line 65 facing it, and the ferroelectric material in between, together constitute a first ferrocapacitor. Similarly, the lower surface (in FIG. 6(a)) of the bit line 64, the portion of the lower word line 65 facing it, and the ferroelectric material in between, together constitute a second ferrocapacitor. Both these ferrocapacitors are within the region marked by a circle on FIG. 6(a). Information can be stored in this memory cell by applying an electric field (E) larger than the coercive field of a ferroelectric layer (Ec) between the pair of word lines 65 and the bit line 64 (i.e. E>Ec). This structure does not require a transistor for each memory cell, so its fabrication process is easier than the structures of FIGS. 1, 2 and 4.

Note that the number of capacitor layers can be increased by increasing the number of ferroelectric layers. Each ferroelectric layer would have parallel bit lines located on one of its sides, and parallel word lines on the other. The word lines adjacent different ferroelectric layers would be in register with each other, as would the bit lines adjacent different ferroelectric layers. Thus, each memory cell includes a number of capacitors which is equal to the number of ferroelectric layers.

Figure 7:
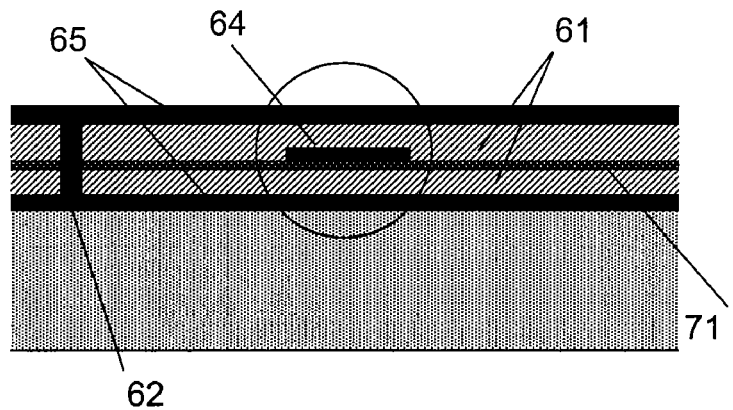
FIG. 7 shows a fourth embodiment of ferroelectric memory device which has an isolation layer.

FIG. 7 shows another embodiment. Elements having the same meaning as in FIG. 6 are given the same reference numerals. An additional isolation layer 71 is located between the adjacent capacitors. Insulation layers are convenient in case of using solvent to coat a ferroelectric layer. They prevent damage of the layer underneath while the upper layer is fabricated. An inorganic material such as $SiO_2$ or an organic material which does not dissolve in the solvent used for coating of ferroelectric layer is suitable for the isolation layer. The isolation layer can also be placed above the bit line instead of below the bit line.

Figure 8:
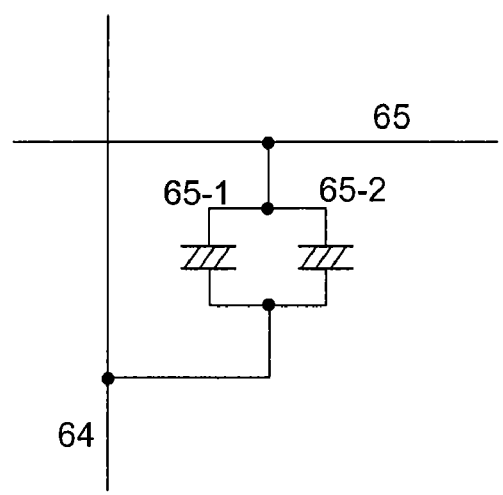
FIG. 8 shows an equivalent circuit diagram of the memory cells of FIG. 6 and FIG. 7.

FIG. 8 shows an equivalent circuit diagram for the memory cells of FIG. 6 and FIG. 7. The ferrocapacitors are marked as 65-1 and 65-2.

Figure 9:
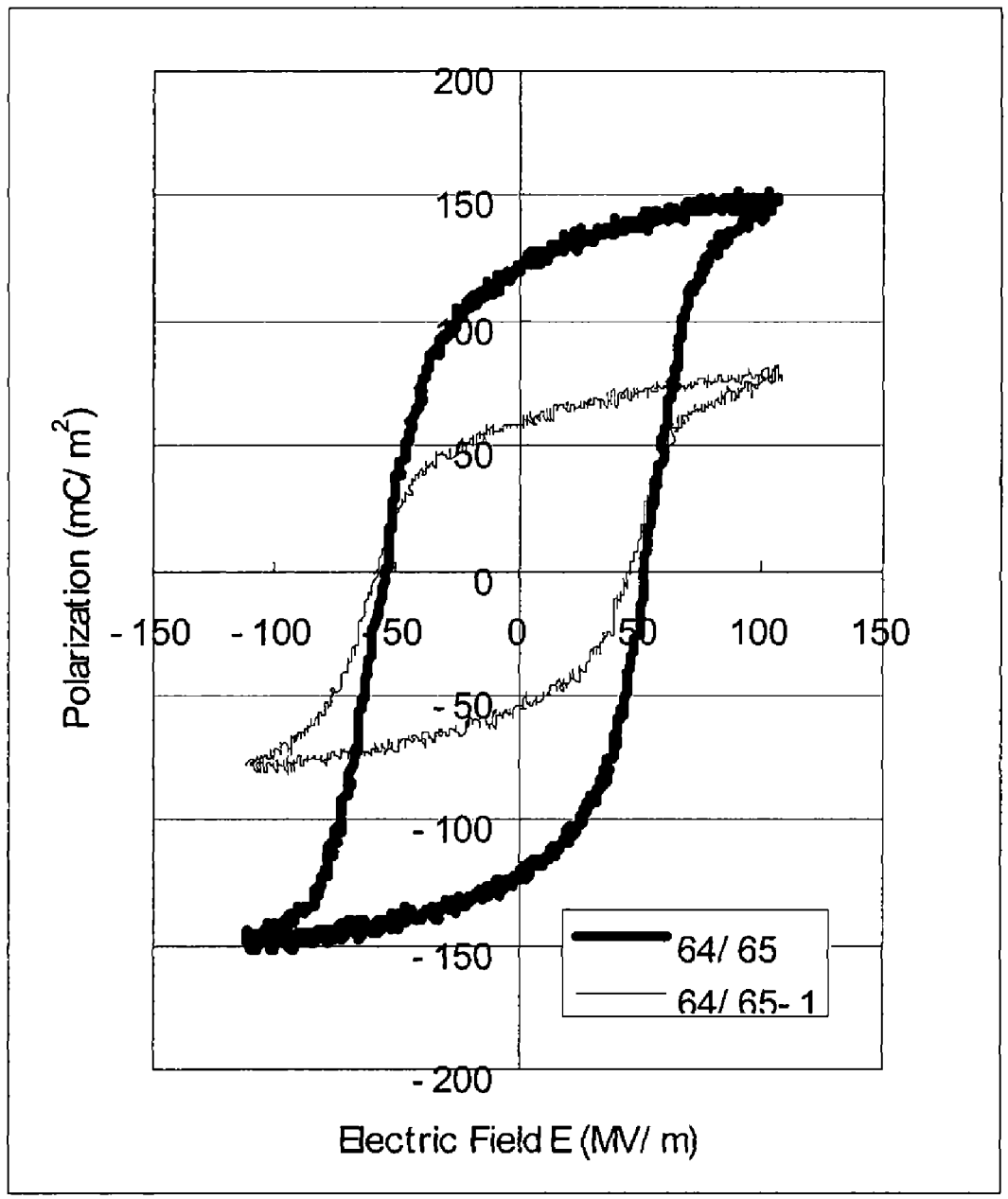
FIG. 9 shows experimental results comparing a single layer capacitor structure with a multilayer structure which is an embodiment of the invention.

FIG. 9 is experimental results comparing two hysteresis loops. In fact, both loops were obtained using a device as illustrated in FIGS. 6 to 8. The smaller loop is measured between the electrodes 64 and 65-1 in FIG. 8, and thus represents results for a single layer structure, essentially equivalent to the a known capacitor having a single layer structure. The larger loop is observed between the electrodes 64 and 65. FIG. 9 indicates that by using a structure with multiple layers, the memorized polarization (i.e. the polarization at the electric field of zero MV/m) can be multiplied proportionally to the number of ferroelectric layers.

Although only four embodiments of the invention have been described in detail here, many variations are possible within the scope of the invention.

For example, while in FIGS. 2 and 4 the same dielectric material is shown as winding continuously through all the capacitor structure, alternatively different insulating materials could be used to form different insulating parts of the capacitor structure. For example, in FIG. 4 it is not necessary that the insulating material which is laterally to the sides of the electrodes 33, 34, 35 (i.e. at the same height above the substrate 7 as one of the electrodes 33, 34, 35) is the same ferroelectric material as that which is located between pairs of those electrodes. In some fabrication techniques the two different sections of insulating material may be formed at different times, and in this case it may be convenient to use different materials in the different fabrication steps.

As a further example while the capacitor layers of the above embodiments are substantially flat and in the plane of the substrate surface, the application is not limited in this respect either, and it would be possible to produce an embodiment which combines the present invention with the concept of a trenched capacitor, in which multiple capacitor layers are stacked one or more of the sides of a trench formed in the substrate.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A memory device comprising:
a plurality of memory cells, each memory cell including a plurality of ferrocapacitors;
at least two layers of ferroelectric material arranged in a stacked configuration;
an isolation layer separating the at least two layers of ferroelectric material;
a plurality of parallel bit lines embedded between the ferroelectric material layers; and
a plurality of parallel word lines extending across a respective outer surface of each of the ferroelectric material layers, the word lines arranged orthogonally with respect to the bit lines, wherein each memory cell and the respective ferrocapacitors are located at an intersection of at least two of the word lines and at least one of the bit lines, information is stored via application of an electric field larger than a coercive field of the ferroelectric material between the word lines and the bit lines, and the same voltage level is applied to at least one pair of respective word lines to generate the electric field,
wherein a first part of the isolation layer contacts the at least two layers of ferroelectric material, and opposite sides of a second part of the isolation layer, at the intersection of the at least two of the word lines and the at least one of the bit lines, contact at least one of the bit lines and one of the ferroelectric material layers; and
wherein at least two adjacent surfaces of each of the bit lines contact one of the ferroelectric material layers.

2. A memory device according to claim 1, wherein each pair of respective word lines are electrically connected by an interconnection through the ferroelectric material layers and the isolation layer.

3. The memory device according to claim 1, wherein each memory cell includes more than two ferrocapacitors.

4. The memory device according to claim 1, wherein each word line is in register with a corresponding word line on the outer surface of the other of the ferroelectric layers.

5. A memory device comprising:
a plurality of memory cells, each memory cell including a plurality of ferrocapacitors;
at least two layers of ferroelectric material arranged in a stacked configuration;
an isolation layer separating the at least two layers of ferroelectric material;
a plurality of parallel bit lines embedded between the ferroelectric material layers; and
a plurality of parallel word lines extending across a respective outer surface of each of the ferroelectric material layers, the word lines arranged orthogonally with respect to the bit lines, wherein each memory cell and the respective ferrocapacitors are located at an intersection of at least two of the word lines and at least one of the bit lines, information is stored via application of an electric field larger than a coercive field of the ferroelectric material between the word lines and the bit lines, and the same voltage level is applied to at least one pair of respective word lines to generate the electric field,
wherein a first part of the isolation layer contacts the at least two layers of ferroelectric material, and opposite sides of a second part of the isolation layer, at the intersection of the at least two of the word lines and the at least one of the bit lines, contact at least one of the bit lines and one of the ferroelectric material layers, and
wherein each of the ferrocapacitors include an upper or lower surface of one of the bit lines, a portion of one of the word lines facing said bit line, and the ferroelectric material therebetween.

* * * * *